United States Patent
Amalfi et al.

(10) Patent No.: US 12,376,268 B2
(45) Date of Patent: Jul. 29, 2025

(54) APPARATUS AND SYSTEM FOR COOLING

(71) Applicant: Accelsius, LLC, Austin, TX (US)

(72) Inventors: Raffaele Luca Amalfi, New Providence, NJ (US); Ryan Enright, Floral Park, NY (US); Vasileios Kafantaris, Athens (GR)

(73) Assignee: Accelsius, LLC, Austin, TX (US)

( * ) Notice: Subject to any disclaimer, the term of this patent is extended or adjusted under 35 U.S.C. 154(b) by 235 days.

(21) Appl. No.: 18/042,090

(22) PCT Filed: Aug. 10, 2021

(86) PCT No.: PCT/EP2021/072211
§ 371 (c)(1),
(2) Date: Feb. 17, 2023

(87) PCT Pub. No.: WO2022/037991
PCT Pub. Date: Feb. 24, 2022

(65) Prior Publication Data
US 2023/0389236 A1    Nov. 30, 2023

(30) Foreign Application Priority Data
Aug. 19, 2020    (EP) ..................................... 20191745

(51) Int. Cl.
*H05K 7/20* (2006.01)
(52) U.S. Cl.
CPC ......... *H05K 7/208* (2013.01); *H05K 7/20836* (2013.01)

(58) Field of Classification Search
CPC ........... H05K 7/20327; H05K 7/20336; H05K 7/20663; H05K 7/20518; H05K 7/208; H05K 7/20836; H05K 7/20381; H05K 7/20818
See application file for complete search history.

(56) References Cited

U.S. PATENT DOCUMENTS

| | | | |
|---|---|---|---|
| 3,427,228 A * | 2/1969 | Constantikes | B01D 3/4216 219/60 R |
| 4,449,377 A * | 5/1984 | Draper | F25B 13/00 62/238.7 |
| 6,371,454 B1 * | 4/2002 | Gerla | B01D 3/20 261/114.5 |

(Continued)

FOREIGN PATENT DOCUMENTS

WO    2020011327 A1    1/2020

OTHER PUBLICATIONS

International Application No. PCT/EP2021/072211 Search Report; Completion Date: Nov. 9, 2021.

*Primary Examiner* — Jacob R Crum
(74) *Attorney, Agent, or Firm* — Geoffrey Lottenberg; Berger Singerman LLP

(57) ABSTRACT

A cooling apparatus includes thermosyphon loops for cooling multiple electronic devices. Each of the thermosyphon loops includes at least one evaporator and at least one condenser. Sensors within the thermosyphon loop measure can measure various parameters such as vapour quality within an inlet and outlet of at least one of the evaporators, total heat load of at least one of the evaporators; and the liquid level in a downcomer of the thermosyphon loop.

17 Claims, 10 Drawing Sheets

(56) References Cited

U.S. PATENT DOCUMENTS

| | | |
|---|---|---|
| 6,388,882 B1* | 5/2002 | Hoover ............... F28D 15/0266 |
| | | 361/689 |
| 9,398,731 B1 | 7/2016 | Imwalle et al. |
| 11,561,033 B1* | 1/2023 | Vaisman ............... F25B 19/005 |
| 2006/0005980 A1* | 1/2006 | Garner ............... H05K 7/20809 |
| | | 174/16.3 |
| 2014/0233173 A1 | 8/2014 | Matsushita et al. |
| 2015/0135746 A1* | 5/2015 | Louvar ................... F24F 11/70 |
| | | 62/200 |
| 2016/0085277 A1 | 3/2016 | Samadiani et al. |

\* cited by examiner

APPARATUS AND SYSTEM FOR COOLING

TECHNOLOGICAL FIELD

Examples of the disclosure relate to apparatus and systems for cooling. Some relate to apparatus and systems for cooling data centres comprising a plurality of electronic devices such as servers.

BACKGROUND

Cooling is essential to enable data centres to function. Efficient apparatus and systems for cooling data centres that consume less energy and reduce any active control are therefore advantageous.

BRIEF SUMMARY

According to various, but not necessarily all, examples of the disclosure there is provided an apparatus comprising: one or more thermosyphon loops for cooling a plurality of electronic devices wherein each of the one or more thermosyphon loops comprises at least one evaporator and at least one condenser; and a plurality of sensors within the thermosyphon loop wherein the sensors are configured to enable measurement of, one or more of; vapour quality within an inlet and outlet of at least one evaporator; total heat load of at least one evaporator; liquid level in a downcomer of the at least one thermosyphon loop.

The apparatus may comprise a thermosyphon loop comprising a plurality of evaporators.

The apparatus may comprise a plurality of thermosyphon loops and each thermosyphon loop comprises at least one evaporator.

The sensors may be configured to enable measurement of liquid level within an accumulator within the downcomer of the at least one thermosyphon loop.

The plurality of evaporators may be arranged in series within a thermosyphon loop. The sensors that are configured to enable measurements of the vapour quality may be provided at the outlet of the last evaporator in the series of evaporators.

The plurality of evaporators may be arranged in parallel within a thermosyphon loop. The sensors are configured to enable measurements of the vapour quality at the outlet of a plurality of the evaporators.

The apparatus may comprise at least one mass flow rate sensor configured to measure mass flow rate within the thermosyphon loop.

The apparatus may comprise at least one pressure sensor configured to measure pressure of working fluid within the at least one thermosyphon loop.

The apparatus may comprise a plurality of temperature sensors provided at different locations within a downcomer of at least one thermosyphon loop.

The apparatus may comprise a plurality of branches within a downcomer of at least one thermosyphon loop and one or more valves are configured to control flow through the different branches.

The different branches may have different diameters.

An expandable portion may be provided within a downcomer of at least one thermosyphon loop.

The downcomer of at least one thermosyphon loop may have a varying diameter along the length of the downcomer so that the downcomer is wider at the top than at the bottom.

The apparatus may be configured to enable one or more of the evaporators to be removed from the thermosyphon loop while the thermosyphon loop is in use.

The thermosyphon loop may be thermally coupled to a secondary cooling system.

The plurality of electronic devices cooled by the apparatus may comprise one or more of; servers, routers, switches, opto-electronic devices.

The plurality of electronic devices may be provided in one or more racks within at least one of: a data centre, a computer room, a telecommunications equipment room, a network room.

The evaporators may comprise one or more of: wick structures, microchannels, array of fins, serpentine arrangement of tubes.

The apparatus may be configured to be controlled by controller such that the controller can use outputs from the one or more sensors to increase efficiency of the apparatus.

According to various, but not necessarily all, examples of the disclosure there may be provided a cooling system comprising a plurality of thermosyphon loops configured so that the plurality of thermosyphon loops are isolated from each other such that no fluid path is provided between thermosyphon loops and wherein a plurality of thermosyphon loops are thermally coupled to a single electronic device so as to enable a first thermosyphon loop to be used to cool the electronic device independently of a second thermosyphon loop.

The cooling system may comprise a plurality of secondary cooling systems configured so that each thermosyphon loop can be thermally coupled to a plurality of secondary cooling systems so as to enable a first secondary cooling system to be used independently of a second secondary cooling system.

Each of the secondary cooling systems may be coupled to a plurality of thermosyphon loops.

The cooling system may be configured so that the secondary cooling systems are isolated from each other such that no fluid path is provided between secondary cooling systems.

BRIEF DESCRIPTION

Some examples will now be described with reference to the accompanying drawings in which:

FIG. 1 schematically shows a thermosyphon loop

DETAILED DESCRIPTION

Figure 1:
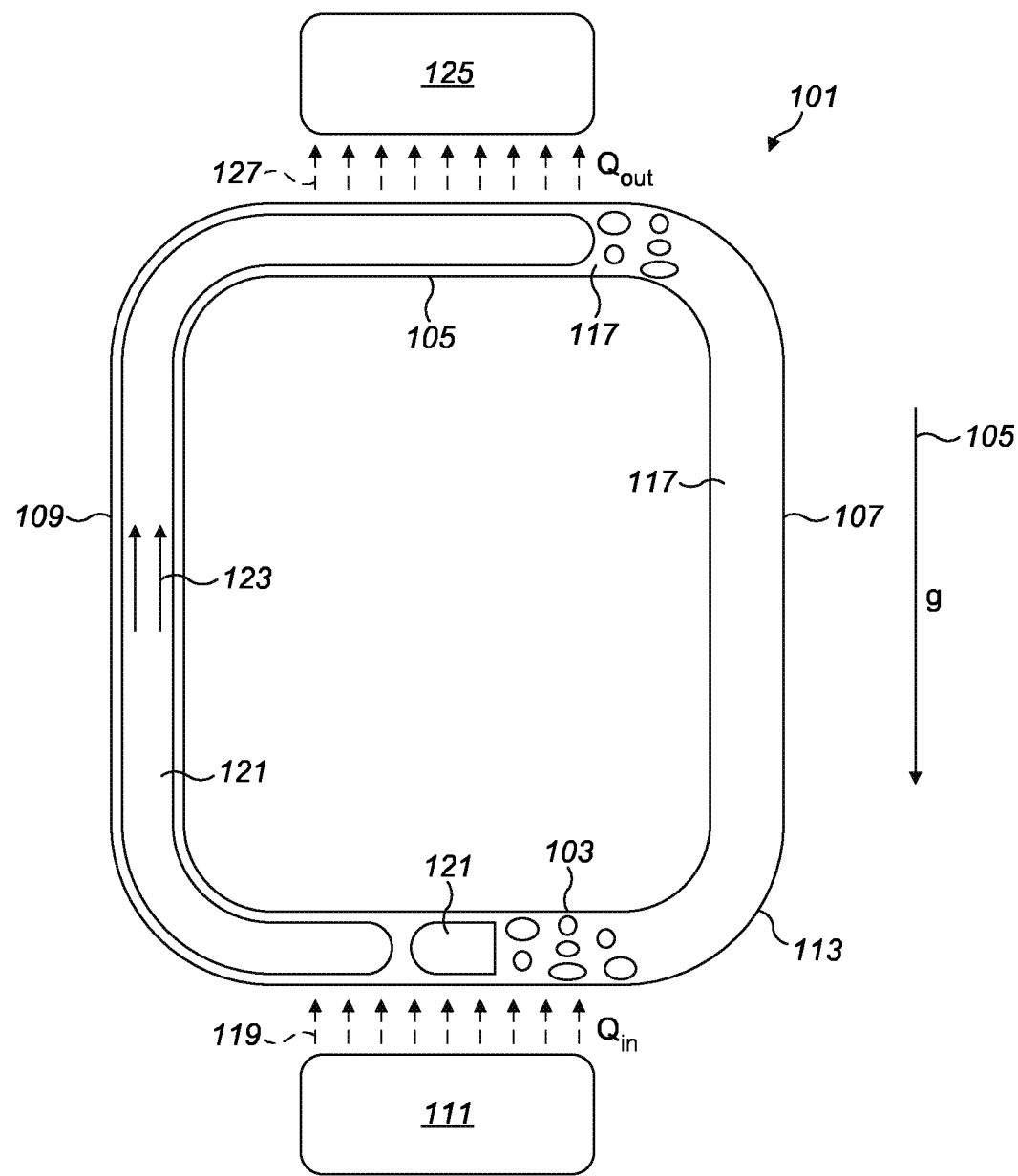

The Figures illustrate an apparatus 201 comprising: one or more thermosyphon loops 101 for cooling a plurality of electronic devices 203 wherein each of the one or more thermosyphon loops 101 comprises at least one evaporator 103 and at least one condenser 105; and a plurality of sensors within the thermosyphon loop 101 wherein the sensors are configured to enable measurement of, one or more of; vapour quality within an inlet and outlet of at least one evaporator 103; total heat load of at least one evaporator, liquid level in a downcomer 107 of the at least one thermosyphon loop 101.

FIG. 1 schematically shows a thermosyphon loop 101. The thermosyphon loop 101 comprises a passive two-phase gravity driven cooling system. The thermosyphon loop 101 comprises an evaporator 103, a condenser 105, a downcomer 107 and a riser 109. A working fluid 113 is provided within the thermosyphon loop 101. When the thermosyphon loop 101 is in use the working fluid 113 circulates through the components of the thermosyphon loop 101.

The evaporator 103 is provided at the bottom of the thermosyphon loop 101 so that the working fluid flows down the downcomer 107 into the evaporator 103 under the force of gravity as indicated by the arrow 115. The height and inner diameter of the downcomer 107 can be selected so that the static head of the fluid within the downcomer 107 causes the fluid to flow through the evaporator 103, riser 109 and condenser 105. The working fluid 113 is in the liquid phase 117 when it is in the downcomer 107.

The evaporator 103 comprises any means for transferring heat from a heat source 111 into the working fluid 113. The evaporator 103 is thermally coupled to the heat source 111. A thermal interface material could be used to enable the evaporator 103 to be thermally coupled to the heat source 111. The heat source 111 could comprise an electronic device that generates unwanted heat during used. The electronic device could be an opto-electronic device. The electronic device could be a server, router, network switch, storage device or any other suitable type of device. In some examples the heat sources can comprise a plurality of electronic devices that could provide a data centre, telecommunication equipment room, or network, a communication room, a computer room, a network room or any other suitable arrangement.

Heat is transferred from the heat source 111 to the working fluid 113 in the evaporator 103 as indicated by the arrows 119. This heat transfer causes a partial evaporation of working fluid 113 within the evaporator 103 and converts the working fluid 113 from a liquid phase 117 into a mixture of liquid and vapour phase. In particular, the evaporator 103 causes some of the working fluid 113 to be converted into the vapour phase 121 while some remains in a liquid phase 117 so that the fluid expelled from the outlet of the evaporator 103 is a two-phase mixture. The two-phase mixture can comprise droplets of vapour entrained within the liquid or other flow regimes depending on the design of the thermosyphon loop 101, heat load, filling ratio and any other suitable factor.

The evaporator 103 is coupled to the riser 109 so that the working fluid expelled from the evaporator 103 flows from the evaporator 103 into the riser 109. This working fluid comprises a two-phase mixture where the vapour phase 121 is less dense than the liquid phase 117. The working fluid 113 within the thermosyphon loop 101 rises through the riser 109, as indicated by the arrows 123, as a result of the balance between the buoyancy force (associated with the two-phase mixture coming out from the evaporator 103) and the gravity force (associated with the liquid coming out from the condenser 105).

The evaporator 103 can comprise structures that enable efficient transfer of heat from the evaporator 103 into the working fluid 113. For example the evaporator 103 could comprise wick structures, microchannels, arrays of fins, a serpentine arrangement of tubes or any suitable combination of such features.

The condenser 105 is provided at the top of the thermosyphon loop 101. The condenser 105 is positioned above the evaporator 103 so that the working fluid 113 flows upwards from the evaporator 103 to the condenser 105.

The condenser 105 is coupled to the riser 109 so that the working fluid 113 in the two-phase mixture (vapour phase 121 and liquid phase 117) flows from the riser 109 into the condenser 105. The condenser 105 can comprise any means for cooling the working fluid 113.

The condenser 105 is thermally coupled to a coolant 125. A thermal interface material could be used to enable the condenser 105 to be thermally coupled to the coolant 125. In other examples the coolant 125 can be directly integrated in the condenser 105 with a wall interface separating the stream of thermosyphon working fluid 113 from the stream of coolant 125. The wall interface can comprise a highly conductive metal or metal alloy, such as copper, aluminum, brass, or any other suitable metal. In some examples the wall interface can comprise highly conductive ceramics such as Aluminum Nitride (AlN), or polymers such as filled polymer composites. The condenser 105 could be a liquid-cooled condenser or any other suitable type of condenser. The condenser can comprise any suitable geometry that enables heat to be removed efficiently from the working fluid.

The condenser 105 enables heat to be transferred from the working fluid 113 to the coolant as indicated by the arrows 127. This heat transfer causes the working fluid 113 to condense back into the liquid phase 117. The working fluid 113 at the outlet of the condenser 105 is therefore in the liquid phase 117.

The condenser 105 is coupled to the downcomer 107 so that the working fluid 113 in the liquid phase 117 can flow down the downcomer 107 by gravity and be returned to the inlet of the evaporator 103.

Thermosyphon loops 101 such as the loop shown in FIG. 1 can be used in apparatus 201 according to examples of the disclosure.

Figure 2:
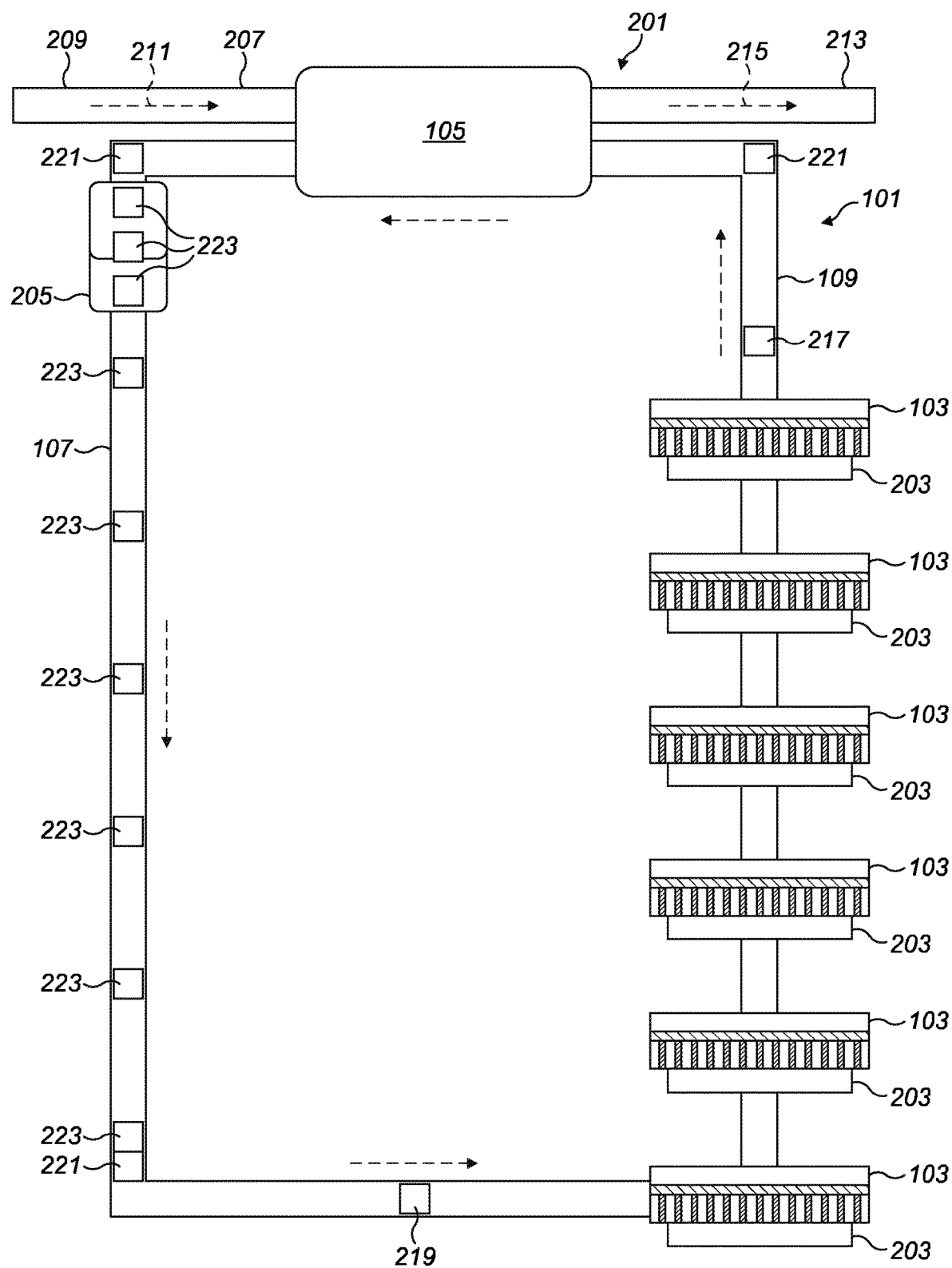
FIG. 2 shows an example apparatus applied to a rack comprising a plurality of electronic devices cooled in series.

FIG. 2 shows an example apparatus 201 according to examples of the disclosure. The apparatus 201 is configured to enable cooling of a plurality of electronic devices 203 in a data centre or in any other suitable environment. The apparatus 201 comprises a thermosyphon loop 101 and a plurality of sensors. The plurality of sensors are distributed throughout the thermosyphon loop 101 to enable different parameters of the thermosyphon loop 101 to be monitored.

In the example of FIG. 2 the thermosyphon loop 101 comprises a plurality of evaporators 103 where each of the evaporators 103 is thermally coupled to an electronic device 203. The electronic device 203 could be a server, a router, a switch, or any other opto-electronic device. The evaporators 103 are coupled to the electronic devices 203 to enable heat from the electronic devices 203 to cause the working fluid 113 in the evaporators 103 to be evaporated. Six electronic devices 203 and corresponding evaporators 103 are shown in FIG. 2, however it is to be appreciated that other numbers of electronic devices 203 and evaporators 103 could be used in other examples of the disclosure.

In the example shown in FIG. 2 the evaporators 103 are arranged in series within the thermosyphon loop 101 so that working fluid 113 expelled from a first evaporator 103 is then provided to the inlet of the next evaporator 103 within the series. In this series arrangement the working fluid 113 passes through each of evaporators 103 sequentially. As the working fluid 113 passes through the evaporators 103 the amount of working fluid 113 in the vapour phase 121 increases, as more heat is absorbed during the evaporation process.

The example apparatus 201 of FIG. 2 comprises an accumulator 205 in the downcomer 107. The accumulator 205 can be a liquid accumulator or a receiver. The accumulator 205 can comprise any means that can be configured to store working fluid 113 in the liquid phase 117. The accumulator 205 stores the working fluid 113 in the liquid phase 117 and helps to prevent the working fluid 113 in the liquid phase 117 from entering the condenser 105 due to the larger cross sectional-area of the accumulator 205 relative to the downcomer. This avoids flooding of the condenser 105 that could result in a decrease in thermal performance of the thermosyphon loop 101.

The condenser 105 comprises a compact heat exchanger. Other types of condenser 105 could be used in other examples of the disclosure. The type of condenser 105 that is used can be selected based on the expected amount of heat that is to be removed from the thermosyphon loop 101. This can be dependent upon the number of electronic devices 203 that are to be cooled by the thermosyphon loop 101.

In the example shown in FIG. 2 a secondary cooling system 207 is coupled to the condenser 105 to enable heat to be transferred out of the thermosyphon loop 101 and data centre environment. In this example water is the coolant and is provided at an inlet 209 as indicated by the arrow 211. The condenser 105 is configured so that heat is then transferred from the working fluid 113 of the thermosyphon loop 101 to the water of the secondary cooling system 207. The heated water is then expelled from the outlet 213 as indicated by the arrow 215.

The apparatus 201 also comprises a plurality of sensors. The sensors are positioned within the thermosyphon loop 101 and are configured to enable measurement of one or more parameters of the thermosyphon loop 101 to be monitored. The parameters that are monitored can relate to the efficiency of the thermosyphon loop 101 and the amount of heat being transferred by the thermosyphon loop 101.

The apparatus 201 comprises at least one sensor configured to obtain a vapour quality measurement 217 within an outlet of at least one evaporator 203. In the example shown in FIG. 2 the plurality of evaporators 103 are arranged in series and the vapour quality measurement 217 is provided at the outlet of the last evaporator 103 in the series.

The vapour quality measurement 217 provides information on the mass of vapour within the outlet of the evaporator 103 and therefore gives a measure of the heat that is being removed by the thermosyphon loop 101. The vapour quality can be calculated considering the sensible and latent contributions to the energy balance. The vapour quality can be calculated by using the following equations:

$$x_{inlet} = \frac{c_p(T_{fl} - T_{sat})}{H_v - H_l}$$

-continued $$x_{outlet} = x_{inlet} + \frac{Q_{tot}}{m(H_v - H_l)}$$

where: $c_p$ is the specific heat of the working fluid in the liquid phase at the constant pressure (J/kg/k), $T_{fl}$ is the temperature in Kelvin of the working fluid in the liquid phase, $T_{sat}$ is the saturation temperature in Kelvin of the working fluid, the difference between $H_v$ and $H_l$ represents the latent heat of vaporization (J/kg) of the working fluid, and m is the mass flow rate in kg/s.

A mass flow rate sensor 219 can be provided within the thermosyphon loop 101. In the example shown in FIG. 2 the mass flow rate sensor 219 is provided at the inlet of the first evaporator 103 in the series of evaporators 103. The mass flow rate sensor 219 is configured to measure the flow rate of the working fluid 113 upstream of the evaporators 103. It is to be appreciated that the mass flow rate sensor 219 could be provided in other locations within the thermosyphon loop 101 in other examples of the disclosure.

In the example shown in FIG. 2 the mass flow rate sensor 219 could be an ultrasonic sensor that allows non-intrusive measurements. Other types of mass flow rate sensor 219 could be used in other examples of the disclosure. The type of mass flow rate sensor 219 that is used can depend on the design of the thermosyphon loop 101, measurement location and any other suitable factor.

The apparatus 201 also comprises pressure sensors 221 configured to measure pressure of the working fluid 113 within the thermosyphon loop 101. The apparatus 201 shown in FIG. 2 comprises three pressure sensors 221. Other numbers of pressure sensors 221 could be used in other examples of the disclosure.

In the example shown in FIG. 2 a first pressure sensor 221 is provided in the downcomer 107 between the condenser 105 and the accumulator 205, a second pressure sensor 221 is provided in the downcomer 107 upstream of the series of evaporators 103 and a third pressure sensor 221 is provided in the riser 109 downstream of the series of evaporators 103. It is to be appreciated that other arrangements of the pressure sensors 221 could be used in other examples of the disclosure.

The pressure sensors 221 give a measurement of the pressure within the thermosyphon loop 101 which can be used to determine the latent heat of vaporization of the working fluid and the saturation temperature of the working fluid within the thermosyphon loop 101.

The apparatus 201 also comprises a plurality of temperature sensors 223 that are positioned at a plurality of different positions within the downcomer 107 and the accumulator 205. In the example of FIG. 2 the apparatus 201 comprises nine temperature sensors 223 at different locations within the downcomer 107 and the accumulator 205. The temperature sensors 223 enable the temperature of the working fluid 113 to be measured. The temperature of the working fluid 113 close to the inlet of the first evaporator 103 can be used to determine the inlet vapour quality at the location of the pressure sensor 221.

The vapour quality measurement 217 at the outlet of the evaporators 103 is calculated based on the inlet vapour quality at the location 221, total power dissipated by the opto-electronic devices 203 and properties of the working fluid 113.

The plurality of temperature sensors 223 also enables the determination of the height of the liquid level in the downcomer 107 of the thermosyphon loop 101 to be determined.

The measurement of the liquid level indicates at what point within the downcomer 107 the working fluid 113 is in the vapour phase. If too much heat is being transferred from the electronic devices 203 this leads to a decrease in the density of the working fluid 113 as more vapour is created, and more liquid is stored in the downcomer 107 If this excess of liquid reaches too far up the downcomer 107 this could lead to flooding of the condenser 105 and could prevent the thermosyphon loop 101 from functioning and so it is useful to monitor the liquid level within the downcomer 107.

The plurality of temperature sensors 223 give an indication of the point at which the temperature of the working fluid 113 within the downcomer 107 reaches the saturation temperature of the working fluid. This indicates the point within the downcomer 107 at which the working fluid 113 is in vapour phase. The measurements provided by the plurality of pressure sensors 221 can be used to determine the saturation temperature for the working fluid 113 within the thermosyphon loop 101.

The outputs of these sensors can be used to help to control the apparatus 201. In some examples the outputs of the sensors can be provided to a controller device or other circuitry that can determine how much heat is being transferred into and out of the thermosyphon loop 101.

In some examples the apparatus 201 can be configured to enable automatic control for the thermosyphon loop 101. The controller can use outputs from the one or more sensors to increase efficiency of the thermosyphon loop 101 or any other part of a system. For instance, the controller can be configured to control parts of the apparatus 201 and to determine the amount of heat being transferred into and out of the thermosyphon loop 101. The heat transfer could be controlled by controlling the function of one or more of the electronic devices 203, by controlling the fluid flow through the thermosyphon loop 101, by controlling the liquid level in the accumulator 205 or by any other suitable means.

In some examples the controller can be configured to enable manual control of the apparatus 201. This could enable a user to receive a notification that then enables the user to decide how to control the system, for example by opening a valve or controlling one or more of the electronic devices 203.

Figure 3:
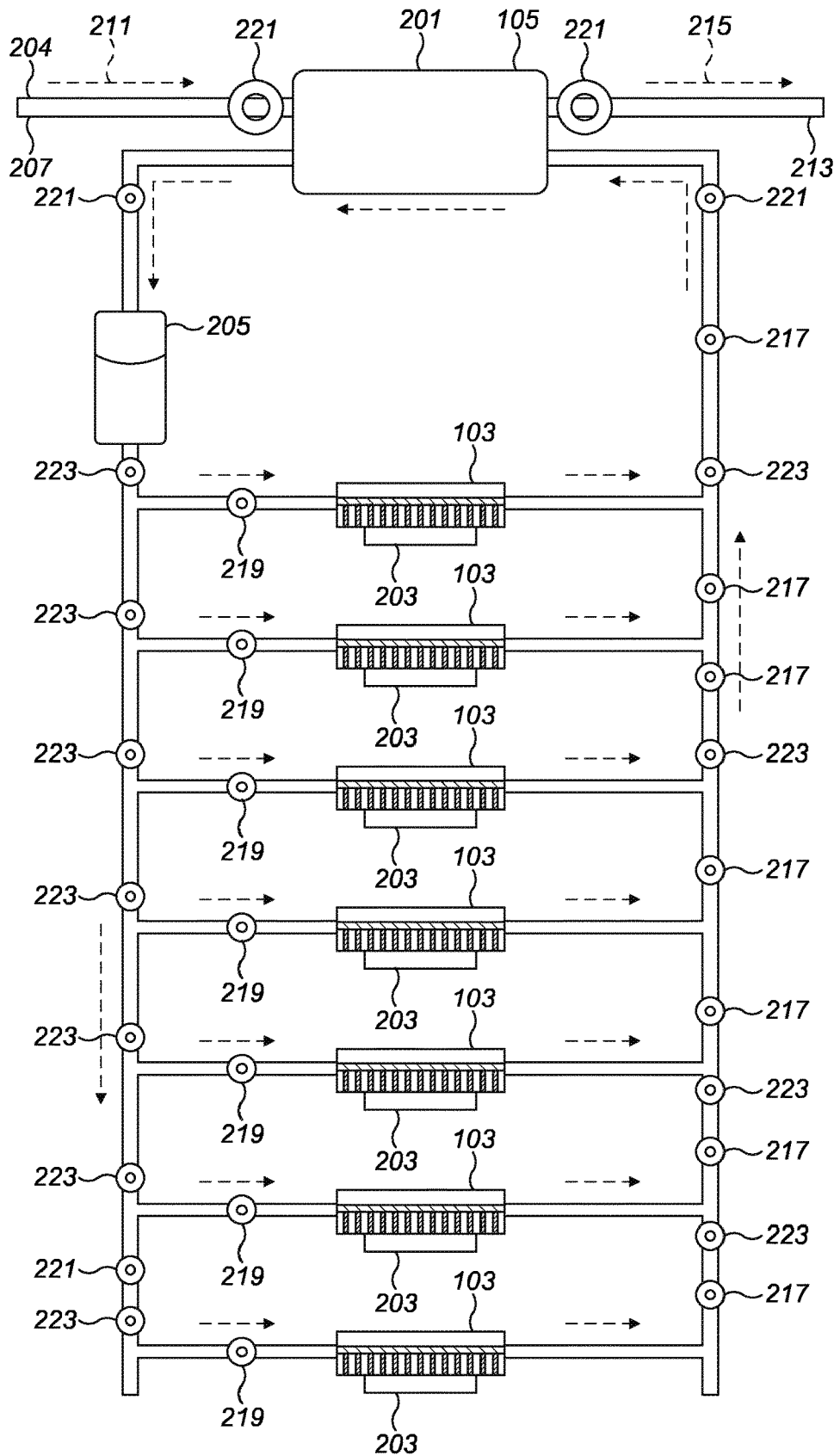
FIG. 3 shows an example apparatus applied to a rack comprising a plurality of electronic devices cooled in parallel.

FIG. 3 shows another example apparatus 201 according to examples of the disclosure. The apparatus 201 is also configured to enable cooling of a plurality of electronic devices 203 in a data centre or in any other suitable environment. The electronic device 203 could be a server, a router, a switch, or any other opto-electronic device. The apparatus 201 also comprises a thermosyphon loop 101 and a plurality of sensors similar to those described in relation to FIG. 2. However in the example of FIG. 3 the plurality of evaporators 103 of the thermosyphon loop 101 are arranged in parallel rather than in series.

The apparatus 201 of FIG. 3 comprises seven evaporators 103 configured to cool seven electronic devices 203. It is to be appreciated that other numbers of electronic devices 203 and evaporators 103 could be used in other examples of the disclosure. The downcomer 107 comprises a branched manifold to provide different inlets for each of the evaporators 103.

Each of the outlets of the evaporators 103 is provided to the riser 109. As the working fluid 113 circulates through the thermosyphon loop 101 the working fluid 113 only passes through one of the evaporators 103.

The example apparatus 201 of FIG. 3 also comprises an accumulator 205 in the downcomer 107. The accumulator 205 can comprise any means that can be configured to store working fluid 113 in the liquid phase 117. The accumulator 205 is positioned between the outlet of the condenser 105 and the inlet for the first evaporator 103.

The condenser 105 in the example of FIG. 3 also comprises a compact heat exchanger. Other types of condenser 105 could be used in other examples of the disclosure. A secondary cooling system 207 is coupled to the condenser 105 to enable heat to be transferred out of the thermosyphon loop 101. As in the example shown in FIG. 2 water is the coolant and it is provided at the inlet 209 as indicated by the arrow 211. The condenser 105 is configured so that heat is then transferred from the working fluid 113 of the thermosyphon loop 101 to the water of the secondary cooling system 207. The heated water is then expelled from the outlet 213 as indicated by the arrow 215.

The apparatus 201 in the example of FIG. 3 also comprises a plurality of sensors. The sensors are positioned within the thermosyphon loop 101 and are configured to enable measurement of one or more parameters of the thermosyphon loop 101 to be monitored. The parameters that are monitored can relate to the efficiency of the thermosyphon loop 101 and the amount of heat being transferred by the thermosyphon loop 101.

The apparatus 201 of FIG. 3 comprises one or more sensors that enable a plurality of vapour quality measurements 217. The vapour quality measurements 217 are provided in the riser 109. A vapour quality measurement 217 is provided after each outlet of an evaporator 103. This can enable the vapour quality to be measured for each outlet of each evaporator 103. The vapour quality can be calculated considering the sensible and latent heat contributions to the energy balance.

The apparatus 201 of FIG. 3 comprises a plurality of mass flow rate sensors 219. The mass flow rate sensors 219 are provided within the inlets of each of the evaporators 103. The mass flow rate sensors 219 are configured to measure the flow rate of the working fluid 113 upstream of each of the evaporators 103.

The apparatus 201 also comprises pressure sensors 221 configured to measure pressure of the working fluid 113 within the thermosyphon loop 101. The apparatus 201 shown in FIG. 3 comprises three pressure sensors 221 within the thermosyphon loop 101. In the example shown in FIG. 3 a first pressure sensor 221 is provided in the downcomer 107 between the condenser 105 and the accumulator 205, a second pressure sensor 221 is provided in a lower point of the downcomer 107 and a third pressure sensor 221 is provided in the riser 109 downstream of the evaporators 103. It is to be appreciated that other arrangements of the pressure sensors 221 could be used in other examples of the disclosure.

In the apparatus 201 of FIG. 3 pressure sensors 221 are also provided within the secondary cooling system 207. In particular a first pressure sensor 221 is provided at the inlet 209 to the condenser 105 and a second pressure sensor 221 is provided at the outlet 213. Other numbers and arrangements of pressure sensors 221 could be used in other examples of the disclosure.

As with the example shown in FIG. 2 the pressure sensors 221 give a measurement of the pressure within the thermosyphon loop 101 which can be used to determine the latent heat of vaporization of the working fluid and saturation temperature within the thermosyphon loop 101.

The apparatus 201 also comprises a plurality of temperature sensors 223 that are positioned at a plurality of different positions within the downcomer 107 and the riser 109. In the example of FIG. 3 the apparatus 201 comprises eleven temperature sensors 223 at different locations within the downcomer 107 and the accumulator 205. Other numbers and arrangements of the temperature sensors 223 can be used in other examples of the disclosure. For example, two temperature sensors 223 can be located at the inlet and outlet of the secondary cooling system 207 in order to quantify the total heat dissipated by the opto-electronic devices 203. The temperature sensors 223 enable the temperature of the working fluid 113 to be measured. The temperature measurements can be used to measure inlet vapour quality and also the liquid level in the downcomer 107. The outputs of these sensors can be used to help to control the apparatus 201 either automatically or with some manual intervention.

Figure 4:
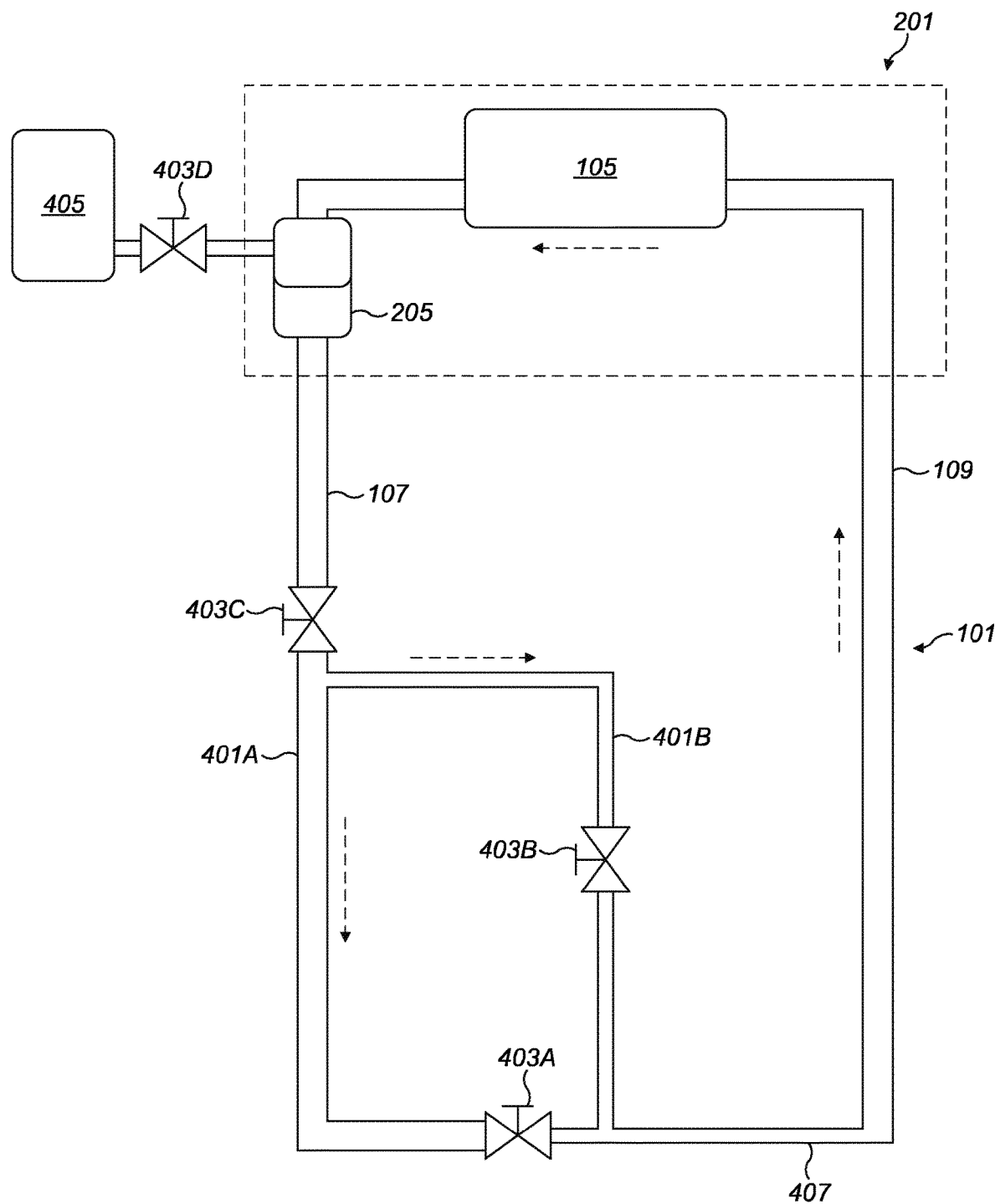
FIG. 4 shows an example apparatus with flow control valves on the downcomer section.

FIG. 4 shows another example apparatus 201 according to examples of the disclosure. The evaporators 103 and electronic devices 203 are not shown in FIG. 4 for clarity. It is to be appreciated that in the example of FIG. 4 a plurality of evaporators 103 could be provided in series as shown in FIG. 2, or in parallel as shown in FIG. 3, or a combination of both. The secondary cooling system 207 and plurality of sensors are also not shown in FIG. 4.

In the example apparatus 201 of FIG. 4 the downcomer 107 of the thermosyphon loop 101 is configured to provide for improved thermal performance and stability of flow of the working fluid 113. The downcomer 107 comprises a plurality of branches 401A, 401B. Each of the branches 401A, 401B provides a conduit or pipe between the condenser 105 and the series of evaporators 103. Each of the branches 401A, 401B is configured to provide a flow path for the working fluid 113. The branches 401A, 401B are configured to provide a flow path for the working fluid 113 in the liquid phase 117.

In the example shown in FIG. 4 two branches 401A, 401B are provided. It is to be appreciated that other numbers of branches 401A, 401B, with different diameters, could be provided in other examples of the disclosure.

A first valve 403A is provided in the first branch 401A. The first valve 403A can be used to control fluid flow through the first branch 401A. A second valve 403B is provided in the second branch 401B to control fluid flow through the second branch 401B. In some examples the valves 403A, 403B can be controlled so that the working fluid 113 flows through either the first branch 401A or the second branch 401B. In the example shown in FIG. 4 the first branch 401A has a larger diameter than the second branch 401B. Controlling which of the branches 401A, 401B is used to provide working fluid 113 to the evaporators 103 enables adjustments of the liquid level in the downcomer 107, which allows to control flow of the working fluid 113 through the thermosyphon loop 101.

In some examples the thermosyphon loop 101 could be configured so that the working fluid 113 could flow through both of the branches 401A, 401B. This could enable three different configurations of the thermosyphon loop 101 to be used. In the first configuration just the first branch 401A is used, in the second configuration just the second branch 401B is used and in the third configuration both the first branch 401A and the second branch 401B are used. This enables three different configurations to control flow of the working fluid 113 through the thermosyphon loop 101.

The apparatus 201 also comprises a third valve 403C in the downcomer 107. The third valve 403C is positioned between the accumulator 205 and the branching point where the downcomer 107 splits into two, or more, branches 401. The third valve 403C can be used to control the amount of working fluid 113 that flows into the branched section of the downcomer 107.

In the example shown in FIG. 4 the apparatus 201 also comprises a reservoir 405. The reservoir 405 can comprise any means that can be configured to store working fluid 113. The reservoir 405 can be configured to store the working fluid 113 in a liquid phase 117.

The reservoir 405 is coupled to the accumulator 205 in the downcomer 107 so that the working fluid 113 can flow from the reservoir 405 to the accumulator 205. A fourth valve 403D is provided between the reservoir 405 and the accumulator 205 to enable flow from the reservoir 405 to the accumulator 205 to be controlled. The fourth valve 403D can be closed when no additional working fluid 113 is needed within the thermosyphon loop 101 and can be opened when additional working fluid 113 is needed within the thermosyphon loop 101.

It is to be appreciated that different variations of the apparatus 201 could have different configurations of the different branches 401. For instance, in some examples more than two branches 401 could be provided. Also the branches 401 can have different diameters. In such examples the flow of working fluid 113 could be controlled by allowing the working fluid 113 to flow through one branch 401 or to flow through two different branches 401.

In some examples the valves 403 can be operated in response to measurements made by the sensors as shown in FIG. 2. For example, if the vapour quality measurements 217 indicate that the vapour quality is above a threshold then it can be determined that a high heat load is being transferred into the working fluid 113. In such cases a high static head in the downcomer 107 is expected, which may flood the condenser 105. In order to prevent this phenomenon, the first valve 403A and the third valve 403C are opened to enable the working fluid 113 to flow through the first branch 401A.

If the vapour quality is below a threshold this indicates that there is a low heat load within the thermosyphon loop 101. In such cases the static head for the liquid level in the downcomer 107 may be too low inducing intermittent flow in the evaporators 103, and thus the second valve 403B and the third valve 403C are opened to enable the working fluid 113 to flow through the second branch 401B. In this example the second branch 401B with the smaller diameter provides for sufficient static head in low heat load cases. In other examples other configurations of the valves, branches, diameters of the branches or any other factors could be used.

In some examples the valves 403A, 403B, 403C, 403D could be operated automatically without any input from a user. For instance, the sensors within the thermosyphon loop 101 could detect whether or not the liquid level and/or the vapour quality is within a threshold range and provide a control signal to the valves 403A, 403B, 403C, 403D that causes the valves 403A, 403B, 403C, 403D to be opened or closed as needed. In some examples this could occur without any manual intervention and so could provide a passive system. In other examples one or more of the valves 403A, 403B, 403C, 403D could be operated manually.

The valves 403A, 403B, 403C, 403D could be any suitable types of valves 403A, 403B, 403C, 403D. In some examples the valves 403A, 403B, 403C, 403D could comprise spring constant valves 403A, 403B, 403C, 403D that can be opened and/or closed using an applied electric signal. Other types of valves 403A, 403B, 403C, 403D could be used in other examples of the disclosure.

In the example shown in FIG. 4 the inlet 407 to the evaporators 103 has a smaller diameter than the riser 109. This is configured to provide a pressure force within the thermosyphon loop 101. This provides for unidirectional flow within the thermosyphon loop 101 and prevents bubble formation at the inlet 407 of the evaporators 103.

Figure 5:
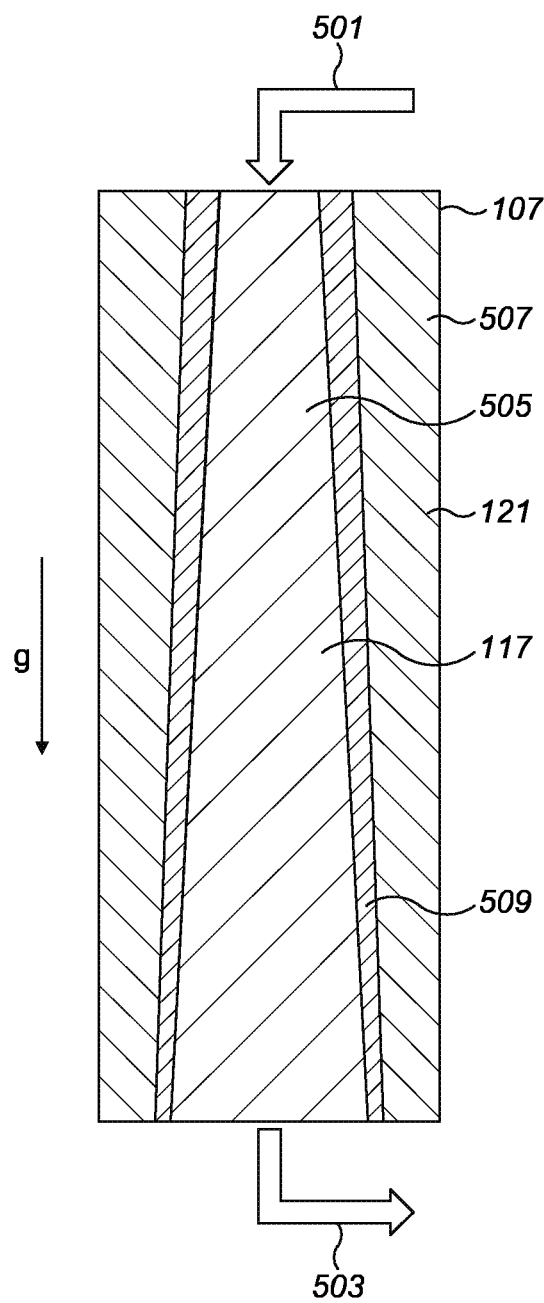
FIG. 5 shows a section of a downcomer.

FIG. 5 shows a cross section of part of a downcomer 107 that could be provided in some example apparatus 201. The example downcomer 107 shown in FIG. 5 could be provided within thermosyphon loops 101 as shown in any of FIGS. 2 to 4. Working fluid 113 from the condenser 105 flows into the downcomer 107 at the top, as indicated by the arrow 501. The working fluid 113 flows down the downcomer 107 under the action of gravity and flows from the downcomer 107 into the one or more evaporators 103 as indicated by the arrow 503.

In the example shown in FIG. 5 the downcomer 107 comprises an expandable portion 505. The expandable portion 505 performs the function of a distributed accumulator 205 as it enables working fluid 113 in the liquid phase 117 to be stored within the downcomer 107.

The downcomer 107 comprises a rigid outer portion 507. The rigid outer portion 507 does not bend or contract during normal use of the thermosyphon loop 101. The rigid outer portion 507 provides constraints on how much the expandable portion 505 can expand.

The expandable portion 505 is provided within the rigid outer portion 507. The expandable portion 505 comprises an elastic wall 509 which is configured to expand or contract depending on the volume of working fluid 113 within the downcomer 107. The elastic wall could be made of rubber or any other suitable material. In the example shown in FIG. 5 the expandable portion 505 is configured with a larger diameter at the bottom than at the top. Working fluid 113 in the liquid phase 117 is provided within the expandable portion 505 of the downcomer 107.

In the example shown in FIG. 5 a spacing is provided between the elastic wall 509 and the rigid portion 507. This provides a space into which the elastic wall 509 can expand. In the example shown in FIG. 5 working fluid 113 in the vapour phase 121 can be provided within the spacing provided between the elastic wall 509 and the rigid portion 507. The vapour can be compressed when the elastic wall 509 expands into the spacing.

The expandable portion 505 of the downcomer 107 ensures that the static head is sufficiently high in cases where there is a low heat load within the thermosyphon loop 101. It is important that the static head of the working fluid 113 is sufficiently high to avoid two phase instability within the working fluid 113 and to prevent intermittent flow within the evaporators 103. When there is a low heat load the void fraction in the riser decreases 109 so that there is less vapour within the thermosyphon loop 101. This causes a decrease in the liquid head of the downcomer 107.

The expandable portion 505 of the downcomer 107 helps to maintain the position of the static head because the diameter of the expandable portion 505 can adjust to the pressure conditions within the thermosyphon loop 101. The expandable portion 505 is configured so that as the pressure head within the thermosyphon loop 101 is reduced the diameter of the expandable portion 505 is also reduced. This enables a larger static head to be provided at lower heat loads.

The variation in the diameter of the expandable portion 505 is controlled by the mechanical properties and the stress-strain behaviour of the elastic walls 509. These can be selected to ensure that the static head is sufficiently high for lower heat loads. In some examples different types of elastic walls 509 with different mechanical properties and stress strain behaviour can be used for different parts of the downcomer 107. This can provide for greater control of the position of the static head within the downcomer 107.

Figure 6A:
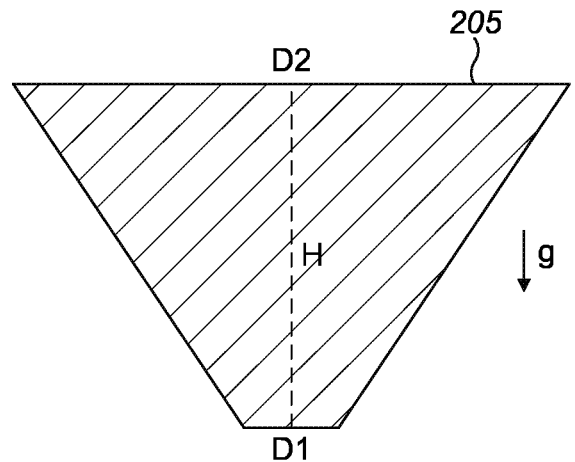
FIGS. 6A and 6B show an example accumulator with a profile designed to manage the liquid head variation with variations in dissipated power.
Figure 6B:
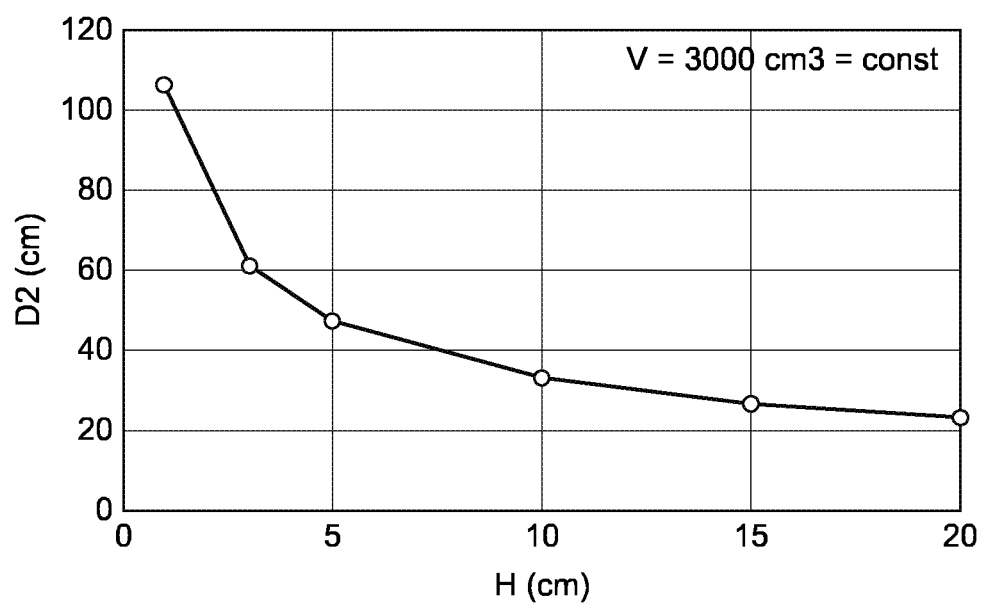

FIGS. 6A and 6B show an example accumulator 205 that could be provided in some example apparatus 201. The accumulator 205 can be a liquid accumulator, a receiver or any other suitable means for storing working fluid 113 within the thermosyphon loop.

FIG. 6A shows a cross section of the accumulator 205. In this example the accumulator 205 has a varying diameter along the length of the accumulator 205. The accumulator 205 has a smaller diameter D1 at the bottom than at the top D2 so that the accumulator is wider at the top than at the bottom. Although the accumulator 205 has been shown in cross section in FIG. 6A it is to be appreciated that the accumulator/205 forms a truncated cone.

FIG. 6B is a plot that shows how the upper diameter of the accumulator 205 has to vary as a function of the height of the accumulator 205 in order to maintain a constant internal volume. In this example a volume of 3000 $cm^3$ has been selected. Other volumes could be used in other examples of the disclosure which would result in different values for the smaller diameter D1 and for the larger diameter D2.

The plot shows that there is an inverse relationship between the upper diameter of the accumulator 205 and the height of the accumulator 205 to keep a constant volume as shown in FIG. 6B. When the diameters and height of the accumulator 205 are being selected the performance considerations and spatial constraints must be taken into account.

The varying diameter of the accumulator 205 used in FIGS. 6A and 6B ensures that at low heat loads there is a sufficiently high liquid head so as to prevent intermittent flow through the evaporators 103. This shape also ensures that at high heat loads the accumulator 205 has sufficient capacity to store the working fluid 113 and prevents flooding of the condenser 105.

This type of accumulator 205 is beneficial as it can enable the liquid level in the accumulator 205 to be controlled without any active control.

Figure 7:
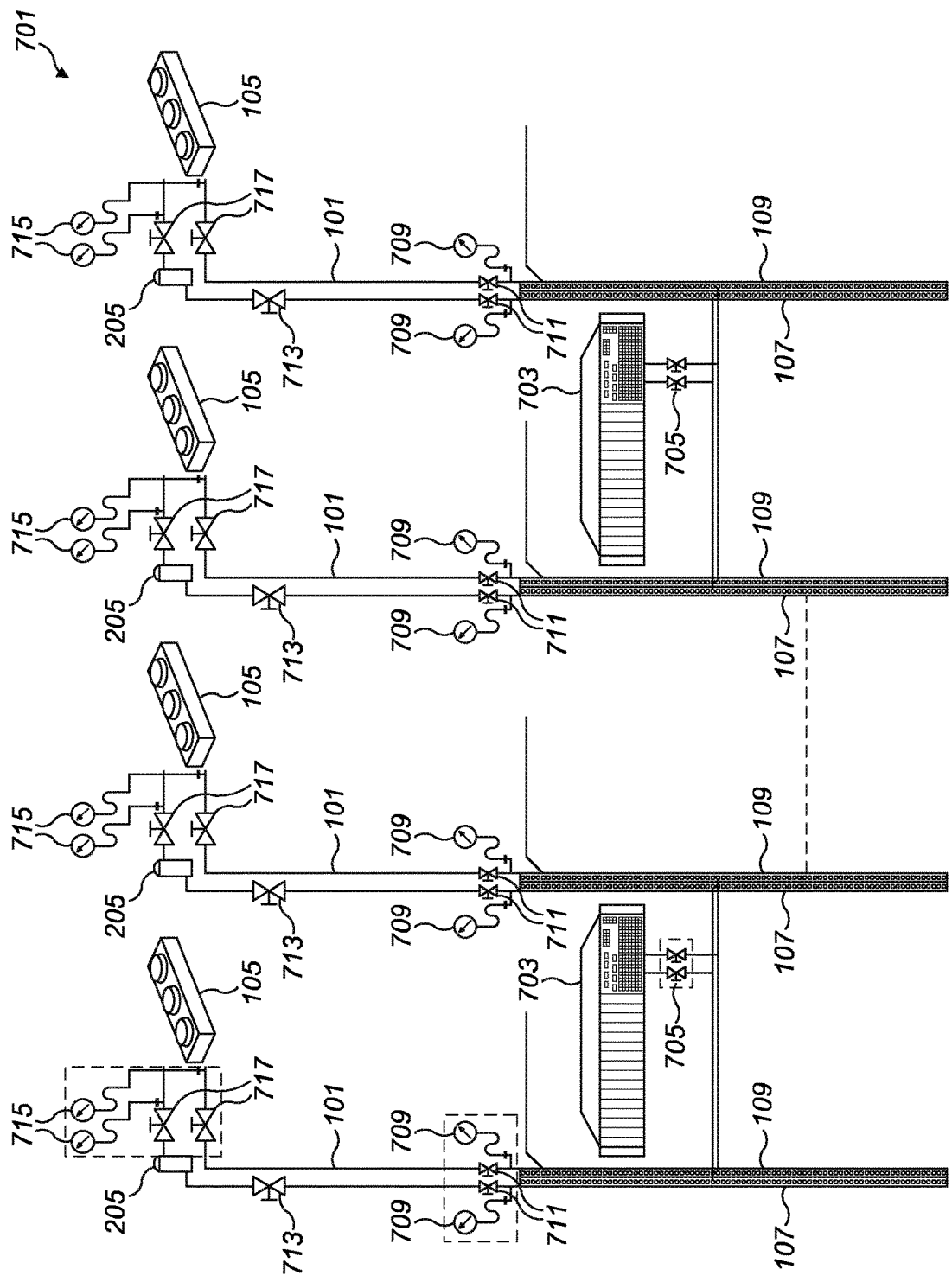
FIG. 7 shows an example apparatus for cooling a plurality of racks in data centres and/or Telco rooms and/or network/communication rooms.

FIG. 7 schematically shows a system 701 for cooling a plurality of racks 703. Each of the racks 703 could comprise a plurality of electronic devices 203. In this example the electronic devices 203 comprise servers. Other types of electronic devices could be used in other examples of the disclosure. The system 701 shown in FIG. 7 uses air-cooled condensers for the secondary cooling system 207 and could be used for smaller data centres of up to around five racks 703 of electronic devices 203.

In the example two racks 703 comprising a plurality of electronic devices 203 are shown. It is to be appreciated that other numbers of racks 703 could be used in other examples of the disclosure.

The system comprises a plurality of thermosyphon loops 101. The thermosyphon loops 101 can be as shown in FIGS. 2 and 3 and can comprise a plurality of evaporators 103 configured to cool a plurality of electronic devices 203 within each of the racks 703. The plurality of thermosyphon loops 101 are isolated from each other such that no fluid path is provided between thermosyphon loops 101. As shown in FIG. 7 plurality of thermosyphon loops 101 can be thermally coupled to a single electronic device so as to enable a first thermosyphon loop 101 to be used to cool the electronic device independently of a second thermosyphon loop 101.

Each of the thermosyphon loops 101 comprises a downcomer 107 and a riser 109. The thermosyphon loops 101 are independent of each other so that working fluid 113 that flows in one of the thermosyphon loops 101 does not flow into any other thermosyphon loops 101. There is no fluid path provided between the thermosyphon loops 101.

It is to be appreciated that the thermosyphon loops 101 can also comprise a plurality of sensors as shown in FIGS. 2 and 3. In some examples the thermosyphon loops 101 can comprise branches and/or a variable accumulator 205 as shown in FIGS. 4 to 6B.

In the example shown in FIG. 7 valves 705 are provided within the thermosyphon loops 101 at the inlet and the outlet of the evaporator 103. These valves 705 can enable the fluid flow to the evaporator 103 to be closed which can enable the evaporator 103 to be removed from the thermosyphon loop 101. The evaporator 103 could be removed for maintenance purposes or any other suitable reason.

In the example shown in FIG. 7 each of the racks 703 are thermally coupled to at least two independent thermosyphon loops 101. The thermosyphon loops 101 are identical to each other so as to enable the total amount (equivalent) of heat to be transferred by any of the thermosyphon loops 101. This can enable the server rack 703 to be cooled effectively by any of the available thermosyphon loops 101. This arrangement enables one of the thermosyphon loops 101 to be closed for maintenance or could enable an auxiliary thermosyphon loop 101 to be used if a primary thermosyphon loop 101 fails. This can enable the electronic devices 103 to run continuously on the cooling system 701 without any break for maintenance and/or in case of failure of one of the thermosyphon loops 101.

The valves 711 on the downcomer 107 and riser 109 can enable evaporators 203 and the thermosyphon loops 101 to be controlled. This can enable the thermosyphon loops 101 to be switched while the electronic device 203 is in operation which allows of continuous use of the electronic device 203 in the rack 703 even while the cooling system is being maintained.

In the example shown in FIG. 7 pressure sensors 709 and valves 711 are provided within the riser 109 and the downcomer 107 of each of the thermosyphon loops 101. The pressure sensors 709 are configured to enable the pressure within the riser 109 and the downcomer 107 to be monitored during use.

The valves 711 can be configured to enable the thermosyphon loop 101 to be removed. In some examples the thermosyphon loop 101 could comprise a plurality of branches that are configured to be coupled to different electronic devices 203 within a rack. In such examples the valve 711 could enable one or more of the branches to be disconnected while other branches remain functioning. Therefore the valves 711 enable part of a branched thermosyphon loop 101 to be closed.

In the example of FIG. 7 each of the thermosyphon loops 101 also comprises a valve 713 provided in the downcomer 107 between the accumulator 205 and the pressure sensor 709 and valves 711. This valve 713 is an on/off valve that is always open when the thermosyphon loop 101 is in use but can be closed to allow for maintenance of the thermosyphon loop 101.

The example system 701 also comprises pressure sensors 715 and valves 717 within the riser 109 and the downcomer 107 of each of the thermosyphon loops 101 close to the condenser 105. The pressure sensors 715 and valves 717 are provided close to the tops of the riser 109 and the downcomer 107. In the downcomer 107 the pressure sensor 715 and valve 717 are provided between the condenser 105 and the accumulator 205. The pressure sensors 715 are configured to enable the pressure close to the top of the riser 109 and the downcomer 107 to be monitored during use.

The valves 717 can be configured to enable the condenser 105 to be removed. This could enable maintenance of the condenser 105 or any other part of the thermosyphon loop 101. Therefore, the valves 717 enable an entire thermosyphon loop 101 to be closed.

In the example shown in FIG. 7 the system 701 comprises an air-cooled condenser 105. Other types of condenser 105 could be used in other examples of the disclosure. For example, if a larger number of racks 703 are to be cooled then the condenser 105 can be coupled to secondary cooling system 207. The secondary cooling system 207 could be a water-cooled cooling system as shown in FIG. 8 or any other suitable type of heat removal system.

Figure 8:
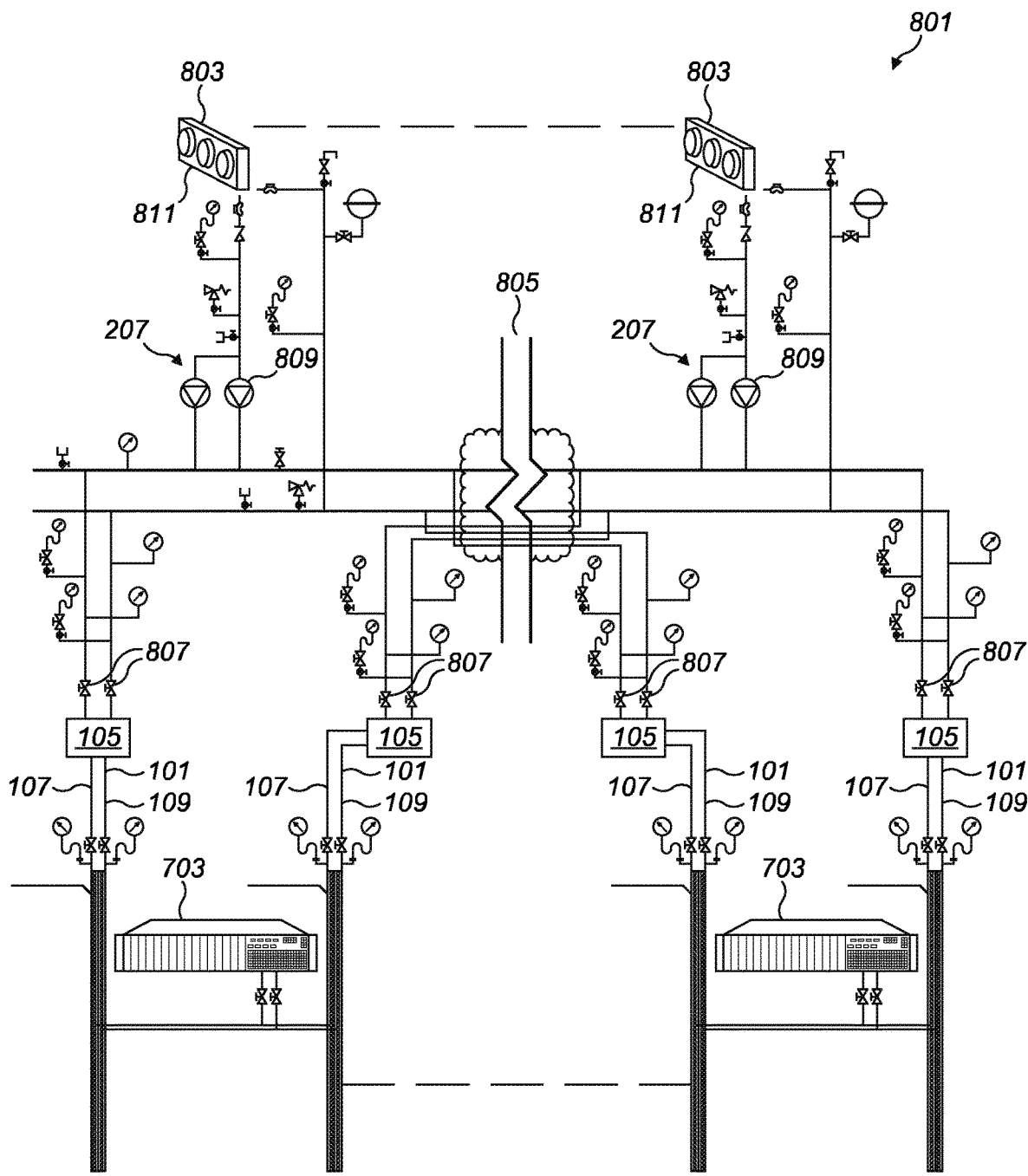
FIG. 8 shows an example apparatus for cooling a plurality of racks comprising a primary rack-level cooling system and a secondary cooling system.

FIG. 8 schematically shows another system 801 for cooling a plurality of racks 703. Each of the racks 703 could comprise a plurality of electronic devices 203 such as servers. The system 801 shown in FIG. 8 uses a plurality of water-cooling systems 803 for the secondary cooling system 207 and could be used for larger data centres comprising more than five racks 703 of electronic devices 203.

The example system 801 shown in FIG. 8 comprises a plurality of thermosyphon loops 101. These can be branched thermosyphon loops 101 that are thermally coupled to the racks 703 of electronic devices 203. The thermosyphon loops 101 in the system 801 of FIG. 8 can be similar to the thermosyphon loops 101 in FIG. 7. The thermosyphon loops 101 can comprise branches and valves that enable thermosyphon loops 101 or parts of thermosyphon loops 101 to be closed for maintenance or other purposes.

The system 801 of FIG. 8 differs from the system of FIG. 7 in that the condensers 105 used in the thermosyphon loops 101 in FIG. 8 comprise water cooled condensers 105. This can enable higher heat loads to be removed from the thermosyphon loops 101 and so can enable the system 801 to be used to cool larger data centres.

In the example shown in FIG. 8 each of the thermosyphon loops 101 is coupled to at least two water cooling systems 803. Each water-cooling system 803 provides an independent secondary cooling system for the thermosyphon loops 101. The water-cooling systems 803 are independent of each other in that water from a first water-cooling system 803 does not flow into any other of the water-cooling systems 803. FIG. 8 schematically shows that a path separation 805 is provided between the different water-cooling systems 803 so that there is no fluid flow between the different water-cooling systems 803.

In the example shown in FIG. 8 of the water-cooling systems 803 each water-cooling systems 803 is capable of removing the same heat loads from the thermosyphon loops 101. This means that the amount of heat that can be removed from the thermosyphon loops 101 is not dependent upon which of the water-cooling systems 803 is used for the secondary cooling.

One or more valves 807 can be provided within the water-cooling systems 803. In the example of FIG. 8 the valves 807 can be provided at the inlets and outlets of the condenser 105 of the thermosyphon loop 101. These valves 807 can be configured to control the flow of water to the condensers 105. These valves 807 can enable the water-cooling system 803 that is coupled to the thermosyphon loop 101 to be swapped. This could be used if one of the water-cooling systems 803 needs to be maintained or is faulty.

Each of the water-cooling systems 803 also comprises one or more pumps 809. The pumps 809 can comprise any means that can be configured to pump the water through the water-cooling systems 803. Each of the water-cooling systems 803 has its own pumping system as the water flow in one water-cooling system 803 is independent of the water flow in another water-cooling system 803.

The water-cooling systems 803 also comprise secondary condensers 811. The secondary condensers 811 can comprise air-cooled dry coolers or any other suitable type of condensers.

The system of FIG. 8 therefore comprises a plurality of secondary water-cooling systems 803 configured so that each thermosyphon loop 101 can be thermally coupled to a plurality of secondary water-cooling systems 803 so as to enable a first secondary water-cooling system 803 to be used independently of a second secondary water-cooling system.

Figure 9:
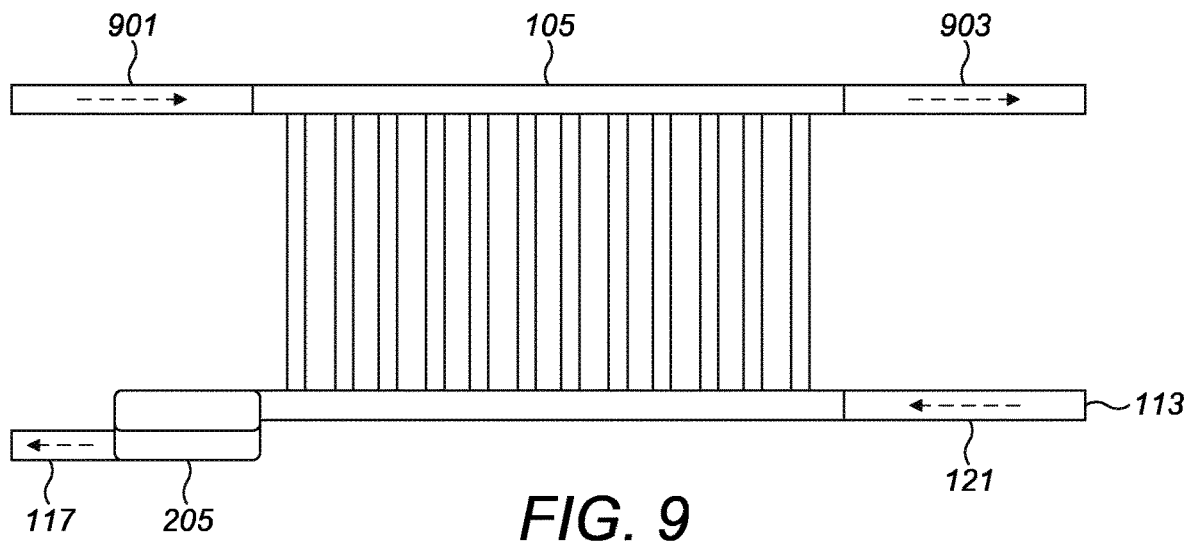
FIG. 9 shows an example condenser.

FIG. 9 shows an example condenser 105 that can be provided within thermosyphon loops 101 in examples of the disclosure. In the example condenser 105 of FIG. 9 the accumulator 205 is provided within the condenser 105. The condenser 105 of FIG. 9 could be used within the thermosyphon loops 101 of any of the example apparatus 201 and systems 801 described above.

In this example the condenser 105 is a water-cooled condenser. Water flows in the inlet 901 and heated water flows out of the outlet 903 into a secondary cooling system 207. The flow within the condenser 105 is not shown in FIG. 9 but could be in a counter-flow, parallel flow or cross flow configuration with respect to the working fluid 113 of the thermosyphon loop 101.

The condenser 105 can be any suitable type of condenser 105. For example, the condenser 105 could comprise a micro-scale heat exchanger, plate heat exchanger, tube-in-tube heat exchanger or shell-and-tube heat exchanger or any other suitable type of heat exchanger.

The amount of heat that can be dissipated can be controlled by changing the design and/or the size of the condenser 105. For example, the number of plates in a plate heat exchanger can be selected based on the heat dissipation needed, overall dimensions to accommodate larger heat exchanger, etc.

The total internal volume of the condenser 105 can be between two to five times the internal volume of the accumulator 205. The relative volumes of the condenser 105 and the accumulator 205 can be dependent upon the volumes of other components within the thermosyphon loop 101.

Figure 10:
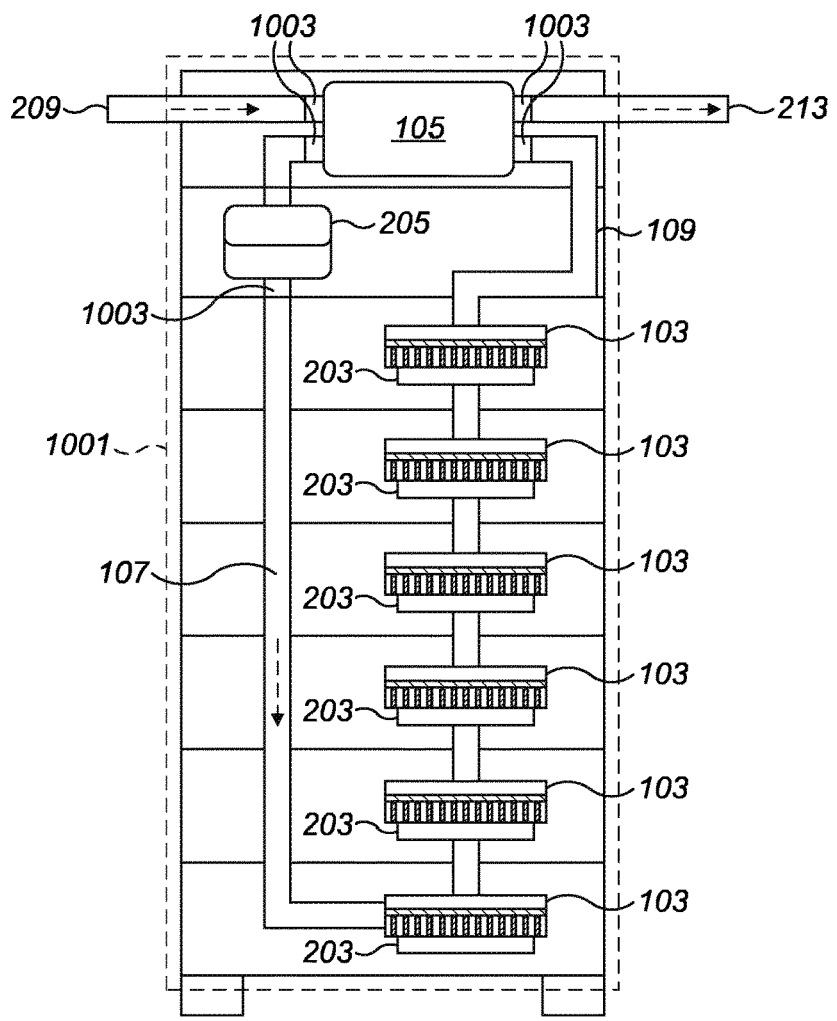
FIG. 10 shows an example apparatus applied to a rack comprising a plurality of electronic devices cooled in series and using an overhead rack condenser.

FIG. 10 shows an example apparatus 201 according to examples of the disclosure. In this example the thermosyphon loop 101 is located within a server cabinet 1001. The thermosyphon loop 101 can be as shown in FIG. 2 and comprises six evaporators 103 connected in series and configured to cool six electronic devices 203. In this example the electronic devices 203 comprise servers. The thermosyphon loop 101 can also comprise a plurality of sensors that are not shown in FIG. 10.

In this example the condenser 105 is a water-cooled condenser 105. Water flows in the inlet 209 and heated water flows out of the outlet 213 into a secondary cooling system 207. It is to be appreciated that the overhead condenser can be also air-cooled if the data centre does not have a room-level pump-driven loop for the secondary cooling system 207.

In the example of FIG. 10 a plurality of quick couplings 1003 are provided within the thermosyphon loop 101. In particular the quick couplings 1003 are provided either side of the accumulator 205 to enable the accumulator 205 to be removed for maintenance or other purposes.

Quick couplings 1003 are also provided in the downcomer 107 and the riser 109 on either side of the condenser 105 to enable the condenser 105 to be removed from the thermosyphon loop 101. Quick couplings 1003 are also provided in the inlet 209 and the outlet 213 to the condenser 105 for the secondary cooling system 207. This can enable the thermosyphon loop 101 to be disconnected from the secondary cooling system 207. Also, the valves 705 can be quick couplings, not shown in FIG. 10, in order to connect the electronic devices 203 to the thermosyphon loop 101 for maintenance or other purposes.

Figure 11:
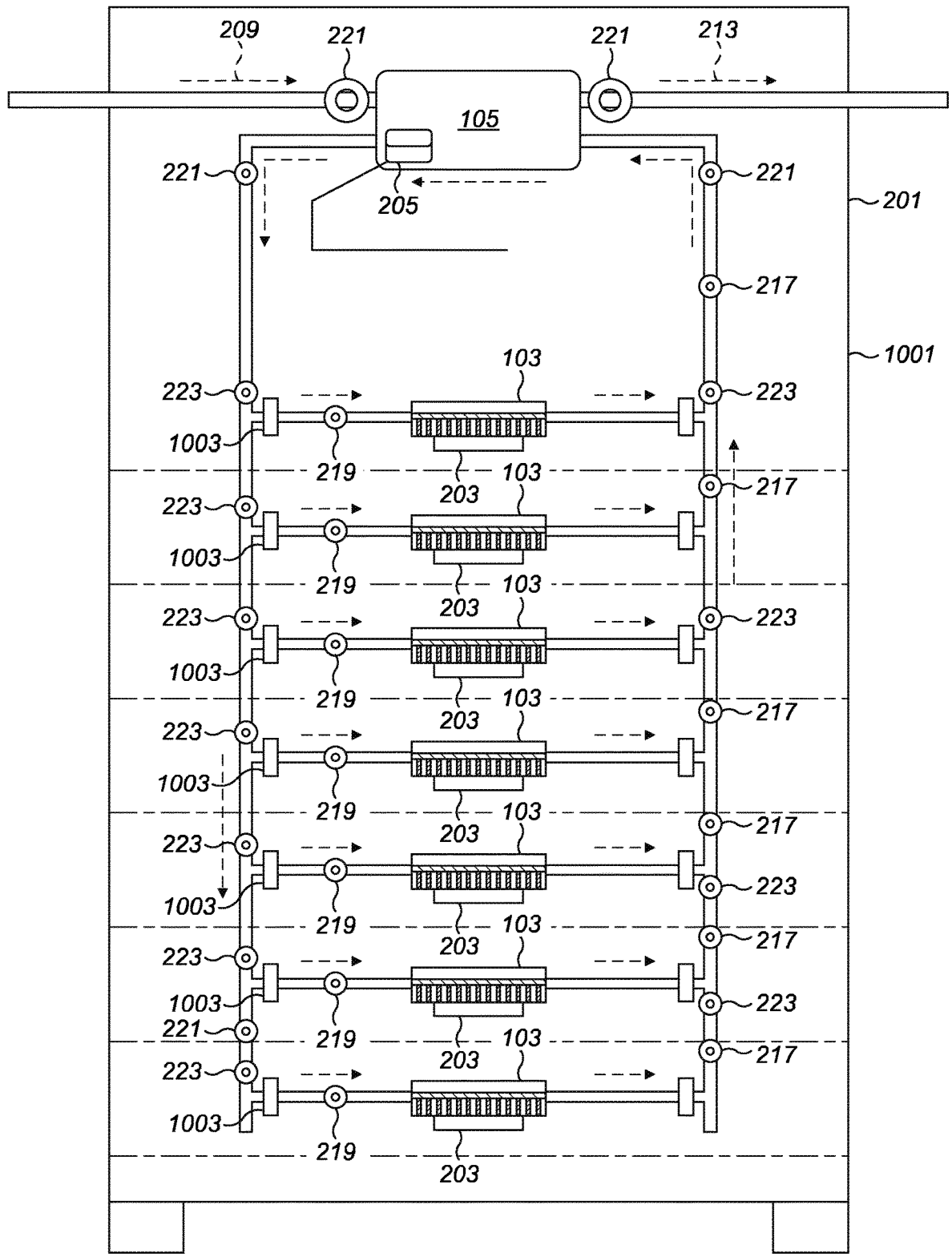
FIG. 11 shows an example apparatus applied to a rack comprising a plurality of electronic devices cooled in parallel and using an overhead rack condenser.

FIG. 11 shows an example apparatus 201 according to another example of the disclosure. In this example the thermosyphon loop 101 is located within a server cabinet 1001. The thermosyphon loop 101 can be as shown in FIG. 3 and comprises seven evaporators 103 connected in parallel and configured to cool seven electronic devices 203. In this example the electronic devices 203 comprise servers. The thermosyphon loop 101 can also comprise a plurality of sensors such as mass flow rate sensors 219, temperature sensors 223, pressure sensor 221, including vapour quality measurements. These can be configured as described in relation to FIG. 3 or in any other suitable configuration.

In this example of FIG. 11 the condenser 105 is a water-cooled condenser 105. Water flows in the inlet 209 and heated water flows out of the outlet 213 into a secondary cooling system 207.

In the example of FIG. 11 a plurality of quick couplings 1003 are provided within the thermosyphon loop 101. In particular the quick couplings 1003 are provided either side of each of the evaporators 103 to enable the evaporators 103 to be removed for maintenance or other purposes.

Examples of the disclosure therefore provide cooling systems that can be used to cool data centres or severs or other similar devices. The use of the plurality of sensors distributed throughout the thermosyphon loops 101 enables different parameters of the cooling systems to be monitored. This can allow for these apparatus 201 and systems to be passively controlled.

The systems can also be compartmentalized so that parts of the systems and apparatus 201 can be removed without affecting the functioning of other parts of the systems and apparatus. This makes the system and apparatus "hot swappable" so that the electronic devices 203 and data centres can continue to function while parts of the cooling system are maintained or closed down for any other purposes.

In the above description the term coupled means operationally coupled. In some examples the component can be coupled so as to enable a fluid such as working fluid to flow between components. In some examples coupled can mean thermally coupled so as to enable transfer of heat between the components.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising:
   one or more thermosyphon loops for cooling a plurality of electronic devices wherein each of the one or more thermosyphon loops comprises at least one evaporator and at least one condenser;
   a plurality of sensors within the thermosyphon loop wherein the sensors are configured to enable measurement of, one or more of;
   vapour quality within an inlet and outlet of at least one evaporator;
   total heat load of at least one evaporator;
   liquid level in a downcomer of the at least one thermosyphon loop; and
   a plurality of branches within a downcomer and one or more valves configured to control flow through different branches of the plurality of branches.

2. The apparatus of claim 1, wherein the apparatus comprises a thermosyphon loop comprising a plurality of evaporators.

3. The apparatus of claim 2, wherein the apparatus comprises a plurality of thermosyphon loops and each thermosyphon loop comprises at least one evaporator.

4. The apparatus of claim 1, wherein the sensors are configured to enable measurement of liquid level within an accumulator within the downcomer of the at least one thermosyphon loop.

5. The apparatus of claim 2, wherein the plurality of evaporators are arranged in series within a thermosyphon loop and the sensors that are configured to enable measurements of the vapour quality are provided at the outlet of a last evaporator in the series of evaporators.

6. The apparatus of claim 2, wherein the plurality of evaporators are arranged in parallel within a thermosyphon loop and the sensors are configured to enable measurements of the vapour quality at the outlet of a plurality of the evaporators.

7. The apparatus of claim 1, comprising at least one mass flow rate sensor configured to measure mass flow rate within at least one of the thermosyphon loops, at least one pressure sensor configured to measure pressure of working fluid within at least one of the thermosyphon loops, a plurality of temperature sensors provided at different locations within the downcomer, or combinations thereof.

8. The apparatus of claim 1, wherein the downcomer of at least one thermosyphon loop has a varying diameter along a length of the downcomer so that the downcomer has a wider top than bottom.

9. The apparatus of claim 1, wherein the thermosyphon loop is thermally coupled to a secondary cooling system.

10. The apparatus of claim 1, wherein the plurality of electronic devices cooled by the apparatus comprise a server, a router, a switches, an opto-electronic device, or combinations thereof.

11. The apparatus of claim 1, wherein the plurality of electronic devices are provided in one or more racks within a data center, a computer room, a telecommunications equipment room, a network room, or combinations thereof.

12. The apparatus of claim 1, wherein the apparatus is configured to be controlled by controller such that the controller can use outputs from the one plurality of sensors to increase efficiency of the apparatus.

13. An apparatus comprising:
   one or more thermosyphon loops for cooling a plurality of electronic devices wherein each of the one or more thermosyphon loops comprises at least one evaporator and at least one condenser;
   one or more sensors within the thermosyphon loop configured to take one or more measurements within the one or more thermosyphon loops, and
   a plurality of branches within a downcomer and one or more valves configured to control flow through different branches of the plurality of branches.

14. An apparatus comprising:
   one or more thermosyphon loops for cooling a plurality of electronic devices wherein each of the one or more thermosyphon loops comprises at least one evaporator and at least one condenser; and one or more sensors within the thermosyphon loop configured to take one or more measurements within the one or more thermosyphon loops, and wherein an expandable portion is provided within a downcomer of at least one thermosyphon loop.

15. The apparatus of claim 14, comprising at least one mass flow rate sensor configured to measure mass flow rate within at least one of the thermosyphon loops, at least one pressure sensor configured to measure pressure of working fluid within at least one of the thermosyphon loops, a plurality of temperature sensors provided at different locations within the downcomer, or combinations thereof.

16. The apparatus of claim 14, wherein the thermosyphon loop is thermally coupled to a secondary cooling system.

17. The apparatus of claim 14, wherein the apparatus is configured to be controlled by controller such that the controller can use outputs from the one or more sensors to increase efficiency of the apparatus.

* * * * *